United States Patent
Chen et al.

(10) Patent No.: US 9,979,399 B2
(45) Date of Patent: May 22, 2018

(54) LEVEL SHIFTER

(71) Applicant: TAIWAN SEMICONDUCTOR MANUFACTURING CO., LTD., Hsin-Chu (TW)

(72) Inventors: Chien-Yuan Chen, Hsinchu (TW); Cheng Hung Lee, Hsinchu (TW); Hung-Jen Liao, Hsin-Chu (TW); Hau-Tai Shieh, Hsinchu (TW); Che-Ju Yeh, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days. days.

(21) Appl. No.: 15/073,948

(22) Filed: Mar. 18, 2016

(65) Prior Publication Data

US 2017/0272075 A1  Sep. 21, 2017

(51) Int. Cl.
*H03L 5/00* (2006.01)
*H03K 19/0185* (2006.01)

(52) U.S. Cl.
CPC .......................... *H03K 19/018521* (2013.01)

(58) Field of Classification Search
CPC ........... H03K 3/356; H03K 19/018521; H03K 19/00315; H03K 17/102; H03K 3/012
USPC ................. 327/306, 333; 326/61–62, 80–81; 307/306, 308
See application file for complete search history.

(56) References Cited

U.S. PATENT DOCUMENTS

| | | | | |
|---|---|---|---|---|
| 4,978,870 A * | 12/1990 | Chen | ............... | H03K 3/356104 326/68 |
| 5,969,542 A * | 10/1999 | Maley | ................... | H03K 3/012 326/17 |
| 6,650,168 B1 * | 11/2003 | Wang | .................. | H03K 17/102 327/333 |
| 6,842,043 B1 * | 1/2005 | Nguyen | .......... | H03K 3/356113 326/68 |
| 7,199,617 B1 * | 4/2007 | Schrom | ......... | H03K 19/018528 326/68 |
| 8,405,442 B2 | 5/2013 | Chen | | |
| 8,436,671 B2 | 5/2013 | Chern et al. | | |
| 8,610,488 B2 | 12/2013 | Yu et al. | | |
| 8,625,240 B2 | 1/2014 | Chung et al. | | |
| 8,847,659 B1 | 9/2014 | Lan et al. | | |
| 9,197,199 B2 | 11/2015 | Huang et al. | | |
| 9,214,933 B2 | 12/2015 | Chern et al. | | |

(Continued)

*Primary Examiner* — Dinh T Le
(74) *Attorney, Agent, or Firm* — Duane Morris LLP

(57) ABSTRACT

A circuit is disclosed. The circuit includes eight MOD transistors and a capacitor, the first MOS transistor having a source coupled to a first predetermined supply voltage (VDDM), a second MOS transistor having a source coupled to a first predetermined supply voltage VDDM, a third MOS transistor having a source coupled to a drain of the first MOS transistor, a fourth MOS transistor having a source coupled to a drain of the second MOS transistor, a fifth MOS transistor having a source coupled to a drain of the third MOS transistor and a gate of the second MOS transistor, and a gate coupled to a gate of the third MOS transistor and an input node, and a drain coupled to ground, a sixth MOS transistor having a source coupled to a drain of the fourth MOS transistor and a gate of the first MOS transistor and an output node.

20 Claims, 4 Drawing Sheets

(56) References Cited

U.S. PATENT DOCUMENTS

2004/0160262 A1* 8/2004 Kim .................. H03K 3/356165
                                                                                                                         327/333

* cited by examiner

| Other Transistors | When all the other transistors are SVT | | | | | | When all the other transistors are LVT | | | | | |
|---|---|---|---|---|---|---|---|---|---|---|---|---|
| Level Shifter Transistors | PMOS: SVT NMOS: ULVT | | PMOS: SVT NMOS: LVT | | PMOS: SVT NMOS: ULVT | | PMOS: SVT NMOS: LVT | | PMOS: SVT NMOS: ULVT | |
| Level Shifter | With Capacitor | Without Capacitor | With Capacitor | Without Capacitor | With Capacitor | Without Capacitor | With Capacitor | Without Capacitor |
| Tall SRAM | 1.00x | 1.10x | 1.00x | 1.02x | 1.00x | 1.00x | 1.00x | 1.06x |
| Wide SRAM | 1.00x | 1.81x | 1.00x | 1.12x | 1.00x | 0.99x | 1.00x | 1.19x |

Fig. 3

LEVEL SHIFTER

BACKGROUND

Level shifters are devices that resolve mixed voltage incompatibility between different parts of a system that operate in multiple voltage domains. They are common in today's complex systems, especially when interfacing with older legacy devices. There are a broad variety of standard, general-purpose level-shifters that utilize or provide a wide range of voltages, frequencies, bit widths and IO types (e.g., open-drain or push-pull) in addition to performance-optimized application specific level shifters for standard device interfaces (e.g., I²C, SD card, SIM card).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 is a table comparing leakage impact with and without a capacitor implemented at the output of a level shifting circuit, in accordance with some embodiments.

DETAILED DESCRIPTION

Figure 1:
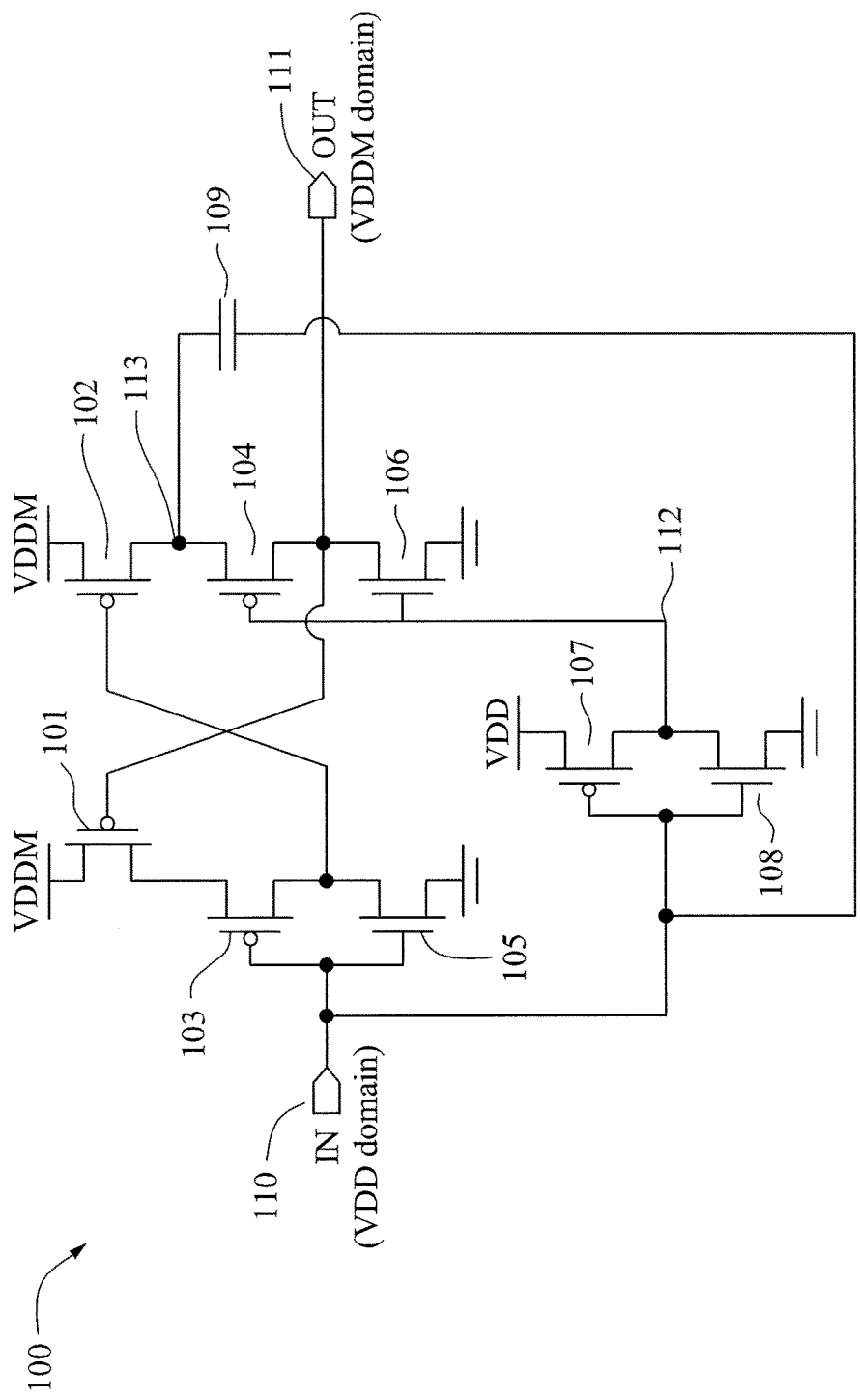
FIG. 1 is a schematic diagram illustrating a level shifter, in accordance with some embodiments.

The following disclosure provides many different embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic diagram illustrating a level shifter 100 in accordance with some embodiments. The level shifter 100 includes a first transistor 101, a second transistor 102, a third transistor 103, a fourth transistor 104, a fifth transistor 105, a sixth transistor 106, a seventh transistor 107, an eighth transistor 108, a capacitor 109, an input node 110 and an output node 111. In one embodiment, the first, second, third, fourth and seventh transistors 101, 102, 103, 104 and 107, respectively, are PMOS transistors, while the fifth, sixth and eighth transistors 105, 106 and 108, respectively, are NMOS transistors. As shown in FIG. 1, a first predetermined supply voltage (VDDM) that provides a first voltage domain is connected to the source of the first transistor 101 and the source of the second transistor 102. The drain of the first transistor 101 is connected to the source of the third transistor 103, and the drain of the second transistor 102 is connected to the source of the fourth transistor 104, at a node 113. The drain of the third transistor 103 is connected to the source of the fifth transistor 105, and the drain of the third transistor 103 and the source of the fifth transistor 105 are also connected to the gate of the second transistor 102.

The gate of the third transistor 103 and the gate of the fifth NMOS transistor 105 are connected together and are further connected to the input node 110 (labeled "VDD domain IN"). The drain of the fourth transistor 104 is connected to the source of the sixth transistor 106, the gate of the first transistor 101, and to an output node 111 (labeled "VDDM domain OUT"). The drains of both the fifth and sixth transistors 105 and 106, respectively, are connected to ground. According to some embodiments, VDD and VDDM are connected to different voltage supplies that operate in or provide different voltage domains. According to some embodiments, VDD is connected to 0.38V supply voltage, and VDDM is connected to 0.72V supply voltage.

The source of the seventh transistor 107 is connected to a second predetermined voltage supply VDD, and the drain of the seventh transistor 107 is connected to the source of the eighth transistor 108 and forms a node designated as node 112. The drain of the eighth transistor 108 is connected to ground. The drain of the seventh transistor 107 and the source of the eighth transistor 108 are further connected to the gate of the fourth transistor 104. The gate of the seventh transistor 107 and the gate of the eighth transistor 108 are connected together and are further connected to the the input node 110. A first capacitive plate of a MOS capacitor 109 is connected to the input node 110 and a second plate of the capacitor 109 is connected to the node 113 and, hence, to the drain of the second transistor 102 and the source of the fourth transistor 104.

The first and second predetermined supply voltages VDDM and VDD discussed above may be any desired voltages. In some embodiments, VDDM provides a first supply voltage to a first set of devices operating in a first voltage domain, while VDD provides a second supply voltage to a second set of devices operating in a second voltage domain, different from the first voltage domain. According to some embodiments, the VDD is 0.38V and the VDDM is 0.72V.

Nearly all digital circuits use a consistent logic level for all internal signals. That level, however, varies from one system to another. Interconnecting any two logic families often requires special techniques such as additional pull-up resistors or purpose-built interface circuits known as level shifters. A level shifter connects one digital circuit that uses one logic level to another digital circuit that uses another logic level. Level shifter circuit 100 is implemented to interface between applications with different supply voltage levels, for example, 0.38V and 0.72V. According to some embodiments, when there is no capacitor 109, during a high to low transition on the input node 110, the discharging current of the second transistor 102 becomes too strong compared to the charging current of the fourth transistor 104. As a result, the current at the node 113 becomes metastable. Meta-stability is a phenomenon that occurs when a system spends an extended period of time in a configuration other than the system's lowest energy state. When the node 113 enters a metastable state, a desired high to low transition at the output node 111 will not occur, as discussed in further detail below with reference to FIG. 2.

Figure 2:
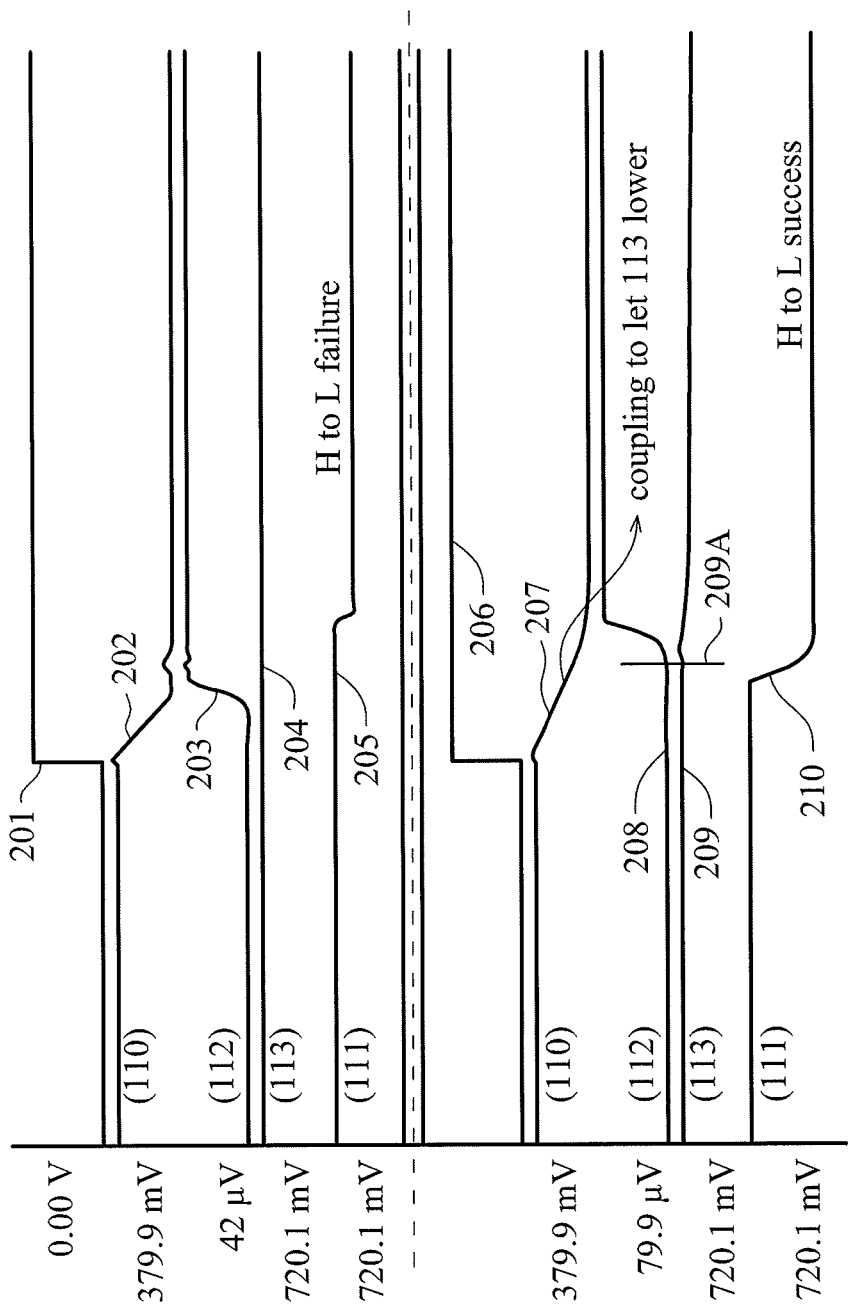
FIG. 2 is a waveform diagram illustrating the waveforms simulated using Monte Carlo simulation program, in accordance with some embodiments.

FIG. 2 is a waveform diagram illustrating the waveforms simulated using a Monte Carlo simulation program simulating the level shifter of FIG. 1, in accordance with some embodiments. The original waveform 201 is the chip input located prior to the input node 110, and the original waveform 201/206 is separated from the input node 110 by a buffer (not shown in FIG. 1). The input signal 202/207 is taken at the input node 110, the signal 203/208 is taken at the node 112, the signal 204/209 is taken at the node 113, and output signal 205/210 is taken at output node 111 as illustrated in FIG. 1. The signal waveforms 201, 202, 203, 204 and 205 are simulated waveforms at their respective points in FIG. 1 without the coupling capacitor 109. The signal waveforms 206, 207, 208, 209 and 210 are simulated waveforms at their respective points in FIG. 1 with the coupling capacitor 109.

The signal waveforms 206-210 illustrate the effect of the coupling capacitor 109. According to some embodiments, a low-to-high transition 201 on the original waveform 201 triggers a high-to-low waveform 202 at the input signal node 110 when there are odd number of stages in the buffer (not shown in FIG. 1). According to other embodiments, when there are an even number of stages in the buffer, a low-to-high transition on the original waveform 201 triggers a low-to-high transition waveform (not shown in FIG. 2) at the input node 110.

According to some embodiments, the high-to-low signal waveform 202 triggers a low-to-high waveform 203 at the node 112. When there is no coupling capacitor 109, the drain current of the second transistor 102 and the source current of the fourth transistor 104 enter a metastable state. The discharging current of the fourth transistor 104 is much stronger compared to the charging current of the sixth transistor 106. As a result, the node 113 voltage signal waveform 204 stays approximately at the same level. An expected high-to-low transition fails to be generated on output signal waveform 205.

The signal waveform 206 is the same as the signal waveform 201 as discussed above, which is a standard low to high transition. Similar to signal waveform 202, the signal waveform 207 is the signal waveform on the node 110. With the coupling capacitor 109 introduced, the signal waveform 207 is a transition from logic high to logic low in the VDD domain. In the VDD domain, logic high is 0.38V. The signal waveform 208 is a signal waveform on the node 112 when the coupling capacitor 109 is introduced. The signal waveform 208 illustrates a transition from logic low to logic high in the VDDM domain, in which the logic high is 0.72V. In comparison to signal waveform 204, when the capacitor 109 couples the input node 110 and the node 113, the node 113 waveform 209 drops 30 mV~40 mV starting from time 209A marked in FIG. 2. Such a drop in the signal waveform 209 of the node 113 causes a desired high-to-low logic transition in the output signal waveform 210. As shown in FIG. 2, the signal waveform 210 drops from a logic high of 0.72V to a logic low of 0V in the VDDM domain as desired.

FIG. 3 is a table comparing the leakage impact with and without the capacitor implemented. According to some embodiments, by adding the coupling capacitor 109, the scheme discussed above produces no leakage impact and keeps the pn ratio intact. According to some embodiments, the pn ratio is the ratio between the PMOS transistor strength and the NMOS transistor strength. A pn junction is a boundary or interface between two types of semiconductor material, the p-type and the n-type, inside a single crystal of semiconductor. It is created by doping, for example by ion implantation, diffusion of dopants, or by epitaxy. In semiconductor devices, leakage is a quantum phenomenon where mobile charge carriers (electrons or holes) tunnel through an insulating region caused by different dopant concentrations of selected materials in adjacent regions, for example. Leakage increases exponentially as the thickness of the insulating region decreases. The threshold voltage, commonly abbreviated as Vth or VGS (th), of a transistor is the minimum gate-to-source voltage differential that is needed to create a conducting path between the source and drain terminals.

Threshold voltage of a transistor is designed such a way that if the gate voltage is below this threshold voltage, the transistor goes to an OFF state. Even in the OFF state, there is still leakage current. If the voltage goes above threshold voltage, the transistor goes to ON state. Transistors having a High Threshold Voltage (HVT) cause less power consumption but switch time is not optimized. Thus, HVT transistors are used in power critical functions. Transistors having a Low Threshold Voltage (LVT) cause more power consumption but switching time is optimized. Thus, LVT transistors are used in time critical functions. Transistors having a Ultra-Low Threshold Voltage (ULVT) cause more power consumption but switching time is better optimized. Transistors having a Standard Threshold Voltage (SVT) offer a trade-off between HVT and LVT transistors, i.e., moderate delay and moderate power consumption. According to some embodiments, if threshold voltages of the transistors are implemented in a mixed manner, the delay time from the level shifter input to output will be changed. As a result, undsired data path timing variations will occur.

According to some embodiments, when all the other transistors (other than the transistors 101, 102, 103, 104, 105 and 106 in the level shifter 100) are SVT transistors, there are two different scenarios. The first scenario is when all the PMOS transistors (i.e., transistors 101, 102, 103 and 104) in the level shifter 100 are SVT transistors, and all the NMOS transistors (i.e., transistors 105 and 106) in the level shifter 100 are ULVT transistors. The second scenario is when all the PMOS transistors (i.e., transistors 101, 102, 103 and 104) in the level shifter 100 are SVT transistors, and all the NMOS transistors (i.e., transistors 105 and 106) in the level shifter 100 are LVT transistors.

In the first scenario, when the capacitor 109 is not implemented, there is leakage in the static random-access memory (SRAM) cells. For SRAM cells with large vertical dimension (depicted as "Tall SRAM" in the table), there is a 10% leakage (depicted as 1.10× in the table). For SRAM cells with large horizontal dimension (depicted as "Wide SRAM" in the table), there is a 81% leakage (depicted as 1.81× in the table). In comparison, when the capacitor 109 is implemented, there is no leakage (or 0.00% leakage, depicted as 1.00× in the table) at all for both the "tall" and "wide" SRAM cells.

Similarly, in the second scenario, when the capacitor 109 is not implemented, there is leakage in the static random-access memory (SRAM) cells. For SRAM cells with large vertical dimension (depicted as "Tall SRAM" in the table), there is a 2% leakage (depicted as 1.02× in the table). For SRAM cells with large horizontal dimension (depicted as "Wide SRAM" in the table), there is a 12% leakage (depicted as 1.12× in the table). In comparison, when the capacitor 109 is implemented, there is no leakage (or 0.00% leakage, depicted as 1.00× in the table) at all for both the "tall" and "wide" SRAM cells.

According to some embodiments, when all the other transistors (other than the transistors 101, 102, 103, 104, 105 and 106 in the level shifter 100) are LVT transistors, there are two different scenarios. The first scenario is when all the PMOS transistors (i.e., transistors 101, 102, 103 and 104) in the level shifter 100 are SVT transistors, and all the NMOS transistors (i.e., transistors 105 and 106) in the level shifter 100 are LVT transistors. The second scenario is when all the PMOS transistors (i.e., transistors 101, 102, 103 and 104) in the level shifter 100 are SVT transistors, and all the NMOS transistors (i.e., transistors 105 and 106) in the level shifter 100 are ULVT transistors.

In the first scenario, when the capacitor 109 is not implemented, there is leakage in the static random-access memory (SRAM) cells. For SRAM cells with large vertical dimension (depicted as "Tall SRAM" in the table), there is a 0% leakage (depicted as 1.0× in the table). For SRAM cells with large horizontal dimension (depicted as "Wide SRAM" in the table), there is a −1% leakage (depicted as 0.99× in the table). In comparison, when the capacitor 109 is implemented, there is no leakage (or 0.00% leakage, depicted as 1.00× in the table) at all for both the "tall" and "wide" SRAM cells.

Similarly, in the second scenario, when the capacitor 109 is not implemented, there is leakage in the static random-access memory (SRAM) cells. For SRAM cells with large vertical dimension (depicted as "Tall SRAM" in the table), there is a 6% leakage (depicted as 1.06× in the table). For SRAM cells with large horizontal dimension (depicted as "Wide SRAM" in the table), there is a 19% leakage (depicted as 1.19× in the table). In comparison, when the capacitor 109 is implemented, there is no leakage (or 0.00% leakage, depicted as 1.00× in the table) at all for both the "tall" and "wide" SRAM cells.

Figure 4:
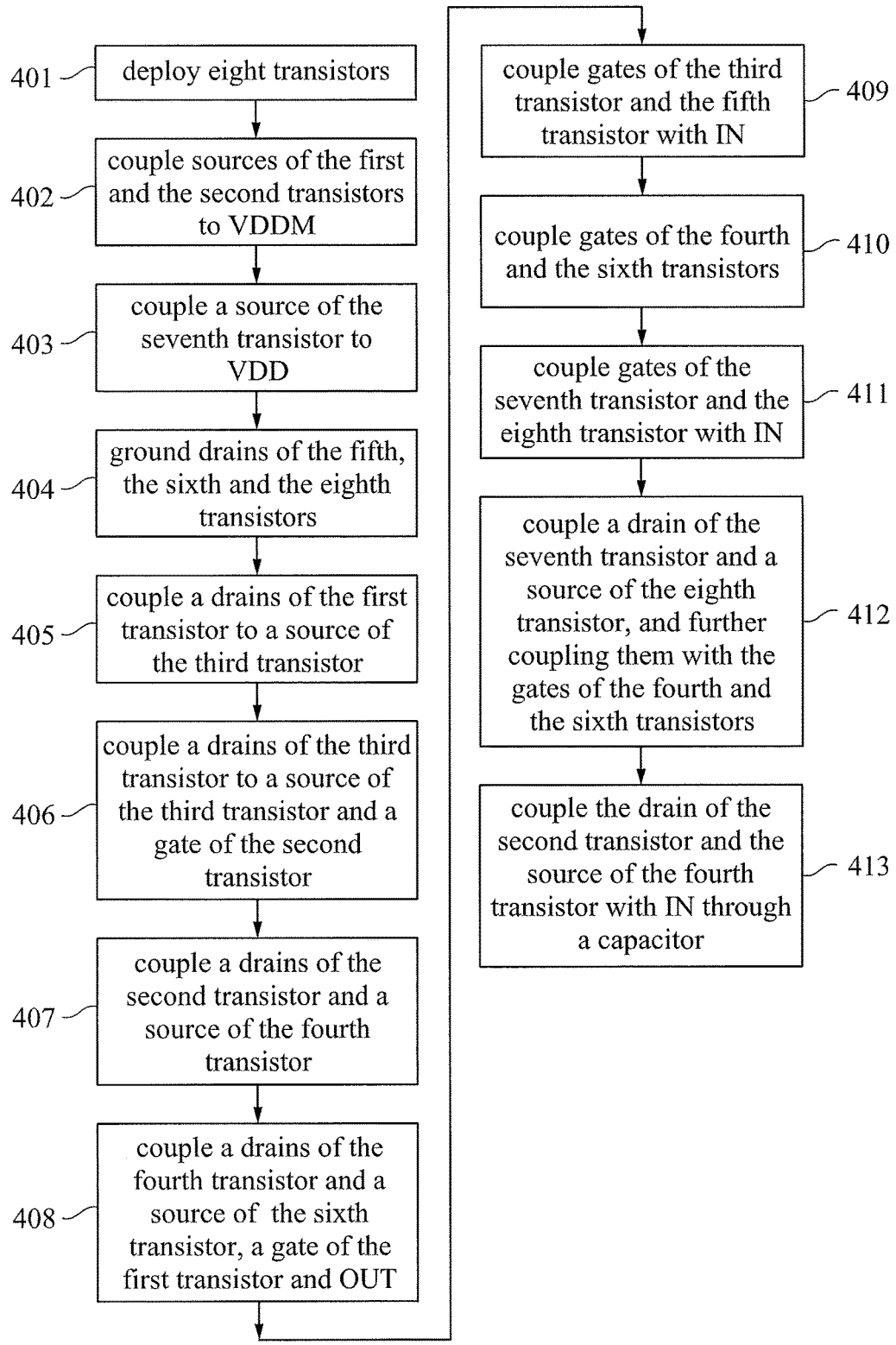
FIG. 4 is a flowchart illustrating a method of configuring a level shifter, in accordance with some embodiments.

FIG. 4 is a flowchart illustrating the method of configuring the level shifter. At step 401, deploying eight transistors; at step 402, coupling sources of the first and the second transistors to a first predetermined voltage supply (VDDM); at step 403, coupling a source of the seventh transistor to a second predetermined supply voltage (VDD); at step 404, grounding the drains of the fifth, the sixth and the eighth transistors; at step 405, coupling a drain of the first transistor to a source of the third transistor; at step 406, coupling a drain of the third transistor to a source of the fifth transistor and a gate of the second transistor; at step 407, coupling a drain of the second transistor and a source of the fourth transistor; at step 408, coupling a drain of the fourth transistor and a source of the sixth transistor, a gate of the first transistor and an output node (OUT); at step 409, coupling gates of the third transistor and the fifth transistor with an input node (IN); at step 410, coupling gates of the fourth and the sixth transistors; at step 411, coupling gates of the seventh transistor and the eighth transistor with the input node (IN); at step 412, coupling a drain of the seventh transistor and a source of the eighth transistor, and further coupling them with the gates of the fourth and the sixth transistors; and at step 413, coupling the drain of the second transistor and the source of the fourth transistor with the input node (IN) through a capacitor.

According to some embodiments, the first MOS transistor is a standard threshold voltage transistor. According to some embodiments, the second MOS transistor is a standard threshold voltage transistor. According to some embodiments, the third MOS transistor is a standard threshold voltage transistor. According to some embodiments, the fourth MOS transistor is a standard threshold voltage transistor. According to some embodiments, the fifth MOS transistor is a standard threshold voltage transistor. According to some embodiments, the sixth MOS transistor is a standard threshold voltage transistor.

According to some embodiments, a level shifter circuit is disclosed. The level shifter circuit includes a first MOS transistor having a source coupled to a first predetermined supply voltage (VDDM), a second MOS transistor having a source coupled to a first predetermined supply voltage (VDDM), a third MOS transistor having a source coupled to a drain of the first MOS transistor and a gate coupled to an input node that operates in a second voltage domain (VDD domain), a fourth MOS transistor having a source coupled to a drain of the second MOS transistor a drain of the fourth MOS transistor being coupled to an output node that operates in a first voltage domain (VDDM domain), and a capacitor having a first plate coupled to the input node and a second plate coupled to the drain of the second transistor. According to some embodiments, the level shifter circuit also includes a fifth MOS transistor having a source coupled to a drain of the third MOS transistor and a gate of the second MOS transistor, and a gate coupled to a gate of the third MOS transistor and an input node, and a drain coupled to ground, a sixth MOS transistor having a source coupled to a drain of the fourth MOS transistor and a gate of the first MOS transistor and an output node, a gate coupled to a gate of the fourth MOS transistor, and a drain coupled to ground. According to some embodiments, the level shifter circuit further includes seventh MOS transistor having a source coupled to a second predetermined supply voltage (VDD) that is different from VDDM, an eighth MOS transistor having a source coupled to a drain of the seventh MOS transistor and the gates of the fourth and sixth MOS transistors, with a gate coupled to a gate of the seventh MOS transistor and the input node, and wherein a drain of the eighth MOS transistor is coupled to ground.

According to some embodiments, the first MOS transistor is a PMOS transistor. According to some embodiments, the second MOS transistor is a PMOS transistor. According to some embodiments, the third MOS transistor is a PMOS transistor. According to some embodiments, the fourth MOS transistor is a PMOS transistor.

According to some embodiments, the fifth MOS transistor is an NMOS transistor. According to some embodiments, the sixth MOS transistor is an NMOS transistor. According to some embodiments, the seventh MOS transistor is a PMOS transistor. According to some embodiments, the eighth MOS transistor is an NMOS transistor.

According to some embodiments, a method is disclosed. The method includes deploying eight MOS transistors, coupling sources of the first and the second MOS transistors to a first predetermined supply voltage (VDDM), coupling a source of the seventh MOS transistor to a second predetermined supply voltage (VDD), grounding drains of the fifth, the sixth and the eighth MOS transistors, coupling a drain of the first MOS transistor to a source of the third MOS transistor, coupling a drain of the third MOS transistor to a source of the fifth MOS transistor and a gate of the second MOS transistor, coupling a drain of the second MOS transistor and a source of the fourth MOS transistor, coupling a drain of the fourth MOS transistor and a source of the sixth MOS transistor, a gate of the first MOS transistor and an output node that operates in a first voltage domain (VDDM domain), coupling gates of the third MOS transistor and the fifth MOS transistor with an input node that operates in a second voltage domain (VDD domain), coupling gates of the fourth and the sixth MOS transistors, coupling gates of the seventh MOS transistor and the eighth MOS transistor with in the input node, coupling a drain of the seventh MOS transistor and a source of the eighth MOS transistor, and further coupling them with the gates of the fourth and the sixth MOS transistors, coupling the first plate of the capacitor to the input node, and coupling the second plate of the capacitor to the drain of the second MOS transistor and the source of the fourth MOS transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A level shifter circuit, comprising:
 a first MOS transistor having a source coupled to a first predetermined supply voltage (VDDM);
 a second MOS transistor having a source coupled to the first predetermined supply voltage (VDDM);
 a third MOS transistor having a source coupled to a drain of the first MOS transistor and a gate coupled to an input node that operates in a second voltage domain (VDD domain);
 a fourth MOS transistor having a source coupled to a drain of the second MOS transistor, a drain of the fourth MOS transistor being coupled to an output node that operates in a first voltage domain (VDDM domain); and
 a capacitor having a first plate coupled to the input node and a second plate coupled to the drain of the second transistor, wherein the capacitor is coupled to the output node through the fourth MOS transistor.

2. The level shifter circuit of claim 1, further comprising:
 a fifth MOS transistor having a source coupled to a drain of the third MOS transistor and a gate of the second MOS transistor, and a gate coupled to a gate of the third MOS transistor and an input node, and a drain coupled to ground; and
 a sixth MOS transistor having a source coupled to a drain of the fourth MOS transistor and a gate of the first MOS transistor and an output node, a gate coupled to a gate of the fourth MOS transistor, and a drain coupled to ground.

3. The level shifter circuit of claim 2, further comprising:
 a seventh MOS transistor having a source coupled to a second predetermined supply voltage (VDD) that is different from VDDM; and
 an eighth MOS transistor having a source coupled to a drain of the seventh MOS transistor and the gates of the fourth and sixth MOS transistors, with a gate coupled to a gate of the seventh MOS transistor and the input node, and wherein a drain of the eighth MOS transistor is coupled to ground.

4. The level shifter circuit of claim 3, wherein the first, second, third, fourth MOS transistor each comprise a PMOS transistor.

5. The level shifter circuit of claim 4, wherein the fifth and sixth MOS transistors each comprise an NMOS transistor.

6. The level shifter circuit of claim 5, wherein the seventh MOS transistor comprises a PMOS transistor and the eighth MOS transistor comprises an NMOS transistor.

7. The level shifter circuit of claim 1, wherein a supply voltage of the second voltage domain (VDD) is 0.38V.

8. The level shifter circuit of claim 1, wherein a supply voltage of the first voltage domain (VDDM) is 0.72V.

9. The level shifter circuit of claim 1, wherein the first, second, third and fourth MOS transistors are standard threshold voltage transistors each having a standard threshold voltage.

10. The level shifter circuit of claim 9, wherein the fifth and the sixth MOS transistors are ultra-low threshold voltage transistors each having a first threshold voltage that is substantially lower than the standard threshold voltage.

11. The level shifter circuit of claim 10, wherein the fifth and the sixth MOS transistors are low threshold voltage transistor each having a second threshold voltage that is substantially lower than the standard threshold voltage but substantially higher than the first threshold voltage.

12. The level shifter circuit of claim 9, wherein the seventh and the eighth MOS transistors are standard threshold voltage transistors each having the standard threshold voltage.

13. The level shifter circuit of claim 9, wherein the seventh and the eighth MOS transistor are low threshold voltage transistors each having a third threshold voltage that is substantially lower than the standard threshold voltage.

14. A method, comprising:
 deploying eight MOS transistors each having a source, a gate and a drain, and a capacitor having a first plate and a second plate;
 coupling sources of the first and the second MOS transistors to a first predetermined supply voltage (VDDM);
 coupling a source of the seventh transistor to a second predetermined supply voltage (VDD);
 coupling the drains of the fifth, the sixth and the eighth MOS transistors to ground;
 coupling a drain of the first MOS transistor to a source of the third MOS transistor;
 coupling a drain of the third MOS transistor to a source of the fifth MOS transistor and a gate of the second MOS transistor; and
 coupling a drain of the fourth MOS transistor, a source of the sixth MOS transistor, and a gate of the first MOS transistor together as an output node that operates in a first voltage domain (VDDM domain),
 wherein the capacitor is coupled to the output node through the fourth transistor.

15. The method of claim 14, further comprising:
 coupling a drain of the second transistor and a source of the MOS fourth transistor.

16. The method of claim 14, further comprising:
 coupling gates of the third MOS transistor and the fifth MOS transistor with an input node that operates in a second voltage domain (VDD domain); and
 coupling gates of the fourth and the sixth MOS transistors.

17. The method of claim 14, further comprising:
coupling gates of the seventh MOS transistor and the eighth MOS transistor with the input node.

18. The method of claim 14, further comprising:
coupling a drain of the seventh MOS transistor and a source of the eighth MOS transistor, and further coupling them with the gates of the fourth and the sixth MOS transistors.

19. The method of claim 14, further comprising:
coupling the first plate of the capacitor to the input node.

20. The method of claim 14, further comprising:
coupling the second plate of the capacitor to the drain of the second MOS transistor and the source of the fourth MOS transistor.

* * * * *